United States Patent
Ito et al.

(10) Patent No.: US 6,297,650 B1
(45) Date of Patent: Oct. 2, 2001

(54) ELECTROOPTIC PROBE

(75) Inventors: Akishige Ito; Katsushi Ohta; Toshiyuki Yagi, all of Tokyo; Mitsuru Shinagawa, Isehara; Tadao Nagatsuma, Sagamihara; Junzo Yamada, Ebina, all of (JP)

(73) Assignees: Ando Electric Co., LTD, Tokyo; Nippon Telegraph & Telephone Corporation, Thiyoda-Ku, both of (JP)

( * ) Notice: Subject to any disclaimer, the term of this patent is extended or adjusted under 35 U.S.C. 154(b) by 0 days.

(21) Appl. No.: 09/374,503

(22) Filed: Aug. 16, 1999

(30) Foreign Application Priority Data

Aug. 19, 1998 (JP) .................................. 10-233351

(51) Int. Cl.⁷ .................................. G01R 31/308
(52) U.S. Cl. ............... 324/753; 324/750; 324/752
(58) Field of Search ............... 324/96, 73.1, 753, 324/754, 758, 770; 359/257, 246, 252, 315

(56) References Cited

U.S. PATENT DOCUMENTS 5,677,635 * 10/1997 Fujii et al. .................. 324/758
5,808,473 * 9/1998 Shinagawa et al. .......... 324/753

FOREIGN PATENT DOCUMENTS

| 0 613 016 A1 | 8/1994 | (EP) . |
| 0 645 635 | 3/1995 | (EP) . |
| 0 784 206 | 7/1997 | (EP) . |
| 0 911 637 A2 | 4/1999 | (EP) . |
| 0 918 224 A2 | 5/1999 | (EP) . |
| 1-193654 | 1/1988 | (JP) . |
| 9-80083 | 9/1995 | (JP) . |
| 9-318710 | 5/1996 | (JP) . |

* cited by examiner

Primary Examiner—Ernest Karlsen
Assistant Examiner—Minh Tang
(74) Attorney, Agent, or Firm—Burns Doane Swecker & Mathis LLP

(57) ABSTRACT

The present invention relates to an electrooptic probe that couples an electrical field generated by a measured signal and an electrooptic crystal, makes light incident on this electrooptic crystal, and measures the waveform of the measured signal by the state of the polarization of the incident light. Here, in the probe body 22, the probe head 23 and the supporting member 44 positioned between the end terminal 22a and the part that encloses the laser diode 25 and the photodiodes 38 and 39 are formed by an insulating body (polyacetal resin). Furthermore, the photodiodes 38 and 39 and the laser diode 25 are covered by electromagnetic shield members 41 and 42 that are separated from each other.

12 Claims, 2 Drawing Sheets

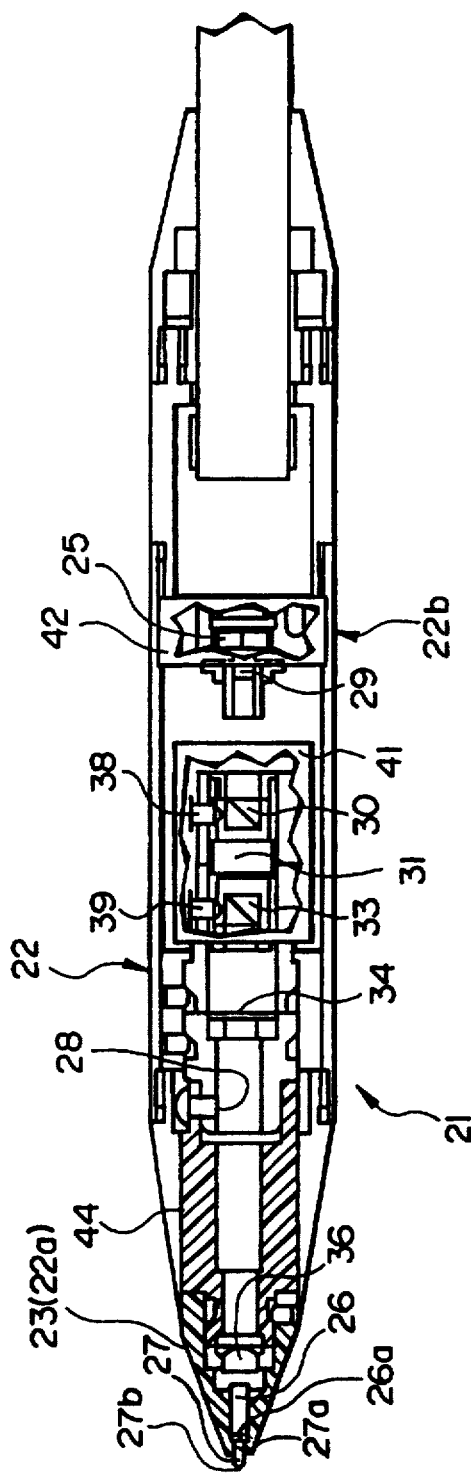
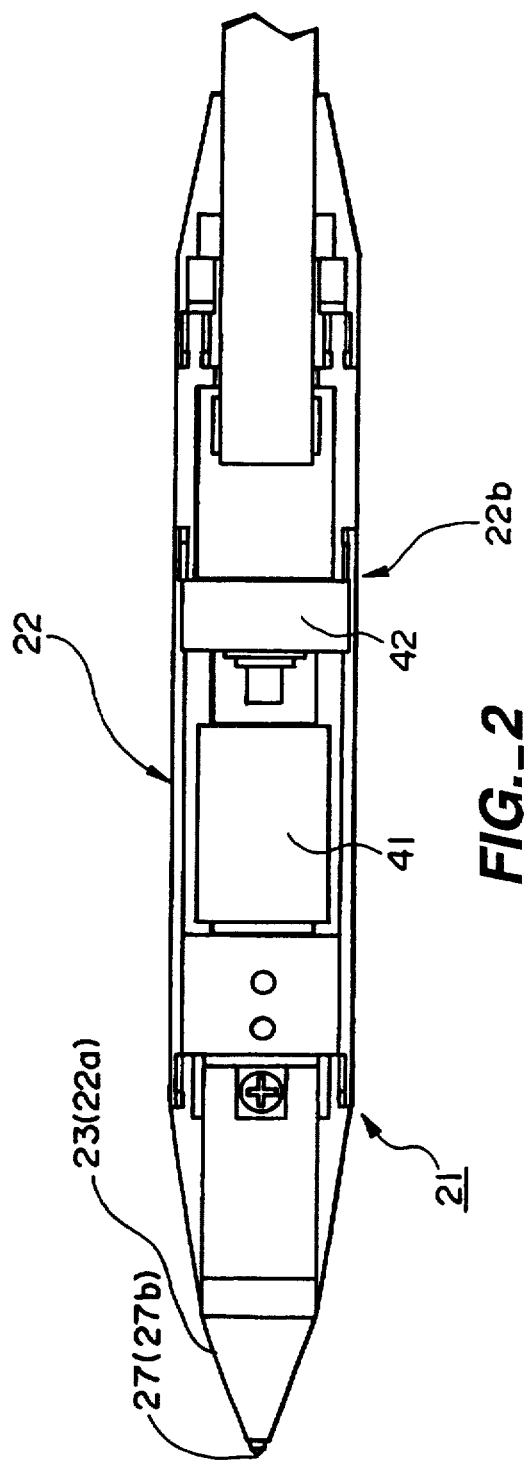

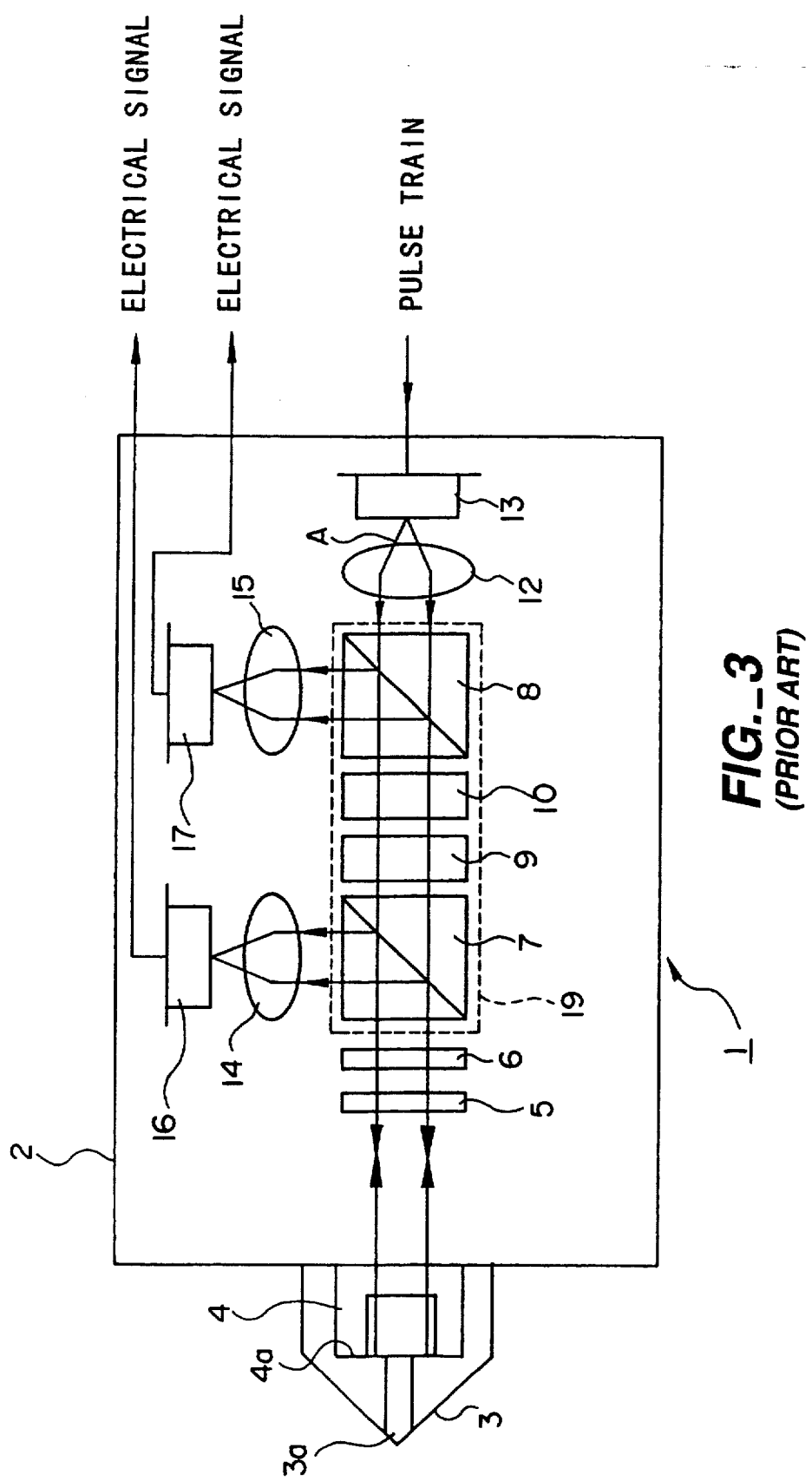
FIG._3 (PRIOR ART)

ELECTROOPTIC PROBE

BACKGROUND OF THE INVENTION

1. Field of the Invention

The present invention relates to an electrooptic probe that couples an electrical field generated by a measured signal and an electrooptic crystal, makes light incident on this electrooptic crystal, and measures the waveform of the measured signal by the state of the polarization of the incident light. This application is based on Patent Application No. Hei 10-233351 filed in Japan, the content of which is incorporated herein by reference.

2. Description of Related Art

It is possible to couple an electrical field generated by a measured signal with an electrooptic crystal, make a laser beam incident on this electrooptic crystal, and observe the waveform of the measured signal by the state of the polarization of the laser beam. It is possible to pulse the laser beam and observe with an extremely high time resolution when sampling the measured signal. An electrooptic sampling oscilloscope uses an electrooptic probe exploiting this phenomenon.

When this electrooptic sampling oscilloscope (hereinbelow, referred to as an "EOS oscilloscope") is compared to a conventional sampling oscilloscope using an electrical probe, the following characteristics have received much attention:

1. It is easy to observe the signal because a ground wire is unnecessary.
2. Because the metallic pin at the end of the electrooptic probe is isolated from the circuit system, it is possible to realize high input impedance, and as a result of this, there is almost no degradation of the state of the measured point.
3. By using an optic pulse, broadband measurement up to the GHz order is possible.

The structure of a probe for an EOS oscilloscope in the conventional technology will be explained using FIG. 3. In the electrooptic probe shown in FIG. 3, a probe head 3 comprising an insulator is mounted on the end terminal of the metallic probe body 2, and a metallic pin 3a is fit into the center. Reference numeral 4 is an electrooptic element, a reflecting film 4a is provided on the end surface on the metallic pin 3a side, and is in contact with the metallic pin 3a. Reference numeral 5 is a ½ wavelength plate, and reference numeral 6 is a ¼ wavelength plate. Reference numeral 7 and 8 are polarized beam splitters. Reference numeral 9 is a ½ wavelength plate, and reference numeral 10 is a laser diode. Reference numerals 14 and 15 are condensing lenses, and reference numerals 16 and 17 are photodiodes.

In addition, the two polarized beam splitters 7 and 8, the ½ wavelength plate 9, and the Faraday element 10 comprise an isolator 19 that transmits the light emitted by the laser diode 13, in order to split the light reflected by the reflecting film 4a.

Next, referring to FIG. 3, the optical path of the laser beam emitted from the laser diode 13 is explained. In FIG. 3, reference letter "A" denotes the optical path of the laser beam.

First, the laser beam emitted from the laser diode 13 is converted by the collimator lens 12 into a parallel beam that travels straight through the polarized beam splitter 8, the Faraday element 10, the ½ wavelength plate 9, and the polarized light beam splitter 7, and then transits the ¼ wavelength plate 6 and the ½ wavelength plate 5, and is incident on the electrooptic element 4. The incident light is reflected by the reflecting film 4a formed on the end surface of the electrooptic element 4 on the side facing the metallic pin 3a.

The reflected laser beam transits the ½ wavelength plate 5 and the ¼ wavelength plate 6, one part of the laser beam is reflected by the polarized light beam splitter 7, condensed by the condensing lens 14, and incident on the photodiode 16. The laser beam that has transited the polarized light beam splitter 7 is reflected by the polarized beam splitter 8, condensed by the condensing lens 15, and incident on the photodiode 17.

Moreover, the angle of rotation of the ½ wavelength plate 5 and the ¼ wavelength plate 6 is adjusted so that the strength of the laser beam incident on the photodiode 16 and the photodiode 17 is uniform.

Next, using the electrooptic probe 1 shown in FIG. 3, the procedure for measuring the measured signal is explained.

When the metallic pin 3a is placed in contact with the measurement point, due to the voltage applied to the metallic pin 3a, at the electrooptic element 4 this electrical field is propagated to the electrooptic element 4, and the phenomenon of the altering of the refractive index due to the Pockels effect occurs. Thereby, the laser beam emitted from the laser diode 13 is incident on the electrooptic element 4, and when the laser beam is propagated along the electrooptic element 4, the polarization state of the beam changes. Additionally, the laser beam having this changed polarization state is reflected by the reflecting film 4a, condensed and incident on the photodiode 16 and the photodiode 17, and converted into an electrical signal.

Along with the change in the voltage at the measurement point, the change in the state of polarization by the electrooptic element 4 becomes the output difference between the photodiode 16 and the photodiode 17, and by detecting this output difference, it is possible to observe the electrical signal applied to the metallic pin 3a.

Moreover, in the above-described electrooptic probe 1, the electrical signals obtained from the photodiodes 16 and 17 are input into an electrooptic sampling oscilloscope, and processed, but instead, it is possible to connect a conventional measuring device such as a real time oscilloscope at the photodiodes 16 and 17 via a dedicated controller. Thereby, it is possible to carry out simply broadband measurement by using the Electrooptic probe 1.

However, in this electrooptic probe 1, the probe head 3 is formed by an insulator, and the probe body 2 that supports the probe head 3 is formed from metal. Due to this, the change in the electrical field of the measured signal propagates as noise to the photodiodes 16 and 17 and the laser diode 13 via the probe body 2, and there is the problem that the S/N ratio during measurement deteriorates.

In addition, in the EOS oscilloscope connected to the photodiodes 16 and 17, there are cases of using a process in which the light from the electrooptic element 4 is converted into an electric signal, is divided and used as the desired sample rate, and because frequency of the noise generated from the display of the oscilloscope is about the same as the signal frequency of the measured signal steped down to a lower frequency by sampling, this kind of noise is detected by the photodiodes 16 and 17, and there is the problem of causing deterioration of the measuring precision.

SUMMARY OF THE INVENTION

In consideration of the above, an object of the present invention is to prevent propagation of noise from the measured signals, display, etc., and improve the S/N ratio during measurement.

In order to resolve the above-described problems, the invention includes an electrooptic probe in which an optical path is established. The probe comprises a probe body having a base terminal, an end terminal, a probe head formed by an insulating body, and a supporting member comprising an insulating body and supporting said probe head, the optical path being established in the probe body between the base terminal and the end terminal of the probe body. The probe further comprises a laser diode disposed at one end of said optical path so as to be enclosed in a first enclosing portion of the base terminal of said probe body, an electrooptic element having a reflecting film and being disposed at the other end of said optical path so as to be enclosed in the end terminal of said probe body, and a metallic pin having a base portion and an end portion, the metallic pin being provided at the end terminal of said probe body and being supported by the probe head so that the base portion of the metallic pin is connected to said electrooptic element and the end portion of the metallic pin protrudes from said probe body. A photodiode is enclosed in a second enclosing portion of said probe body and an isolator is disposed in the optical path, wherein a laser beam generated from said laser diode is incident the electrooptic element via the optical path, the laser beam being reflected by the reflecting film provided on said electrooptic element and being separated by the isolator so as to impinge the photodiode and thereby be converted into an electric signal, and wherein the probe head, the first enclosing portion and the second enclosing portion are disposed so as to be separated from each other, and wherein said supporting member is disposed between the probe head, the first enclosing portion and the second enclosing portion.

By making this kind of structure, in this electrooptic probe, the fluctuation in the field by the measured signal can be prevented from being transmitted via the probe body to the laser diode and the photodiode by an insulating body.

Further in accordance with the invention, an electrooptic probe is provided in which an optical path is established, the probe comprising a probe body having a base terminal, an end terminal, a probe head formed by an insulating body, and a supporting member comprising an insulating body and supporting said probe head, the optical path being established in the probe body between the base terminal and the end terminal of the probe body. The probe further comprises a laser diode disposed at one end of said optical path so as to be enclosed in the base terminal of said probe body, an electrooptic element having a reflecting film and being disposed at the other end of said optical path so as to be enclosed in the end terminal of said probe body, and a metallic pin having a base portion and an end portion, the metallic pin being provided at the end terminal of the probe body so that the base portion of the metallic pin is connected to said electrooptic element and the end portion protrudes from said probe body. An isolator is mounted in the optical path, a photodiode enclosed in the probe body, and an electromagnetic shield member provided so as to surround the photodiode and the laser diode, wherein a laser beam generated from said laser diode is incident on said electrooptic element via said optical path, and is reflected by the reflecting film to be split by the isolator and then converted by the photodiode into an electric signal.

By making this kind of structure, in this electrooptic probe, it is possible to prevent detection of external noise by the laser diode and the photodiode.

BRIEF DESCRIPTION OF THE DRAWINGS

FIG. 1 is a cut-away drawing of an electrooptic probe schematically showing an embodiment of the present invention.

FIG. 2 is a planar drawing of the same.

FIG. 3 is a simplified drawing of the electrooptic probe schematically showing the conventional technology of the present invention.

DESCRIPTION OF PREFERRED EMBODIMENT

Below, an embodiment of the present invention is explained referring to the drawings. FIG. 1 and FIG. 2 are a cut-away drawing and a planar drawing of the electrooptic probe 21 showing an embodiment of the present invention. In this electrooptic probe 21, the end terminal 22a of the probe body 22 is formed by a probe head 23, and at the same time the laser diode 25 connected to the EOS oscilloscope (not shown) is enclosed in the base terminal 22b of the probe body 22. In addition, the electrooptic element 26 is enclosed in the probe head 23.

In addition, at the end of the probe head 23, a metallic pin 27 is provided. This metallic pin 27 is supported by the probe head 23, and at the same time this base terminal 27a connects to the electrooptic element 26, and this end terminal 27b protrudes from the probe head 23. In addition, a reflecting film 26a is formed on the end surface of the electrooptic element 26.

From the right in the figure, a collimator lens 29, a polarized beam splitter 30, a Faraday element 31, a polarized beam splitter 33, a ¼ wavelength plate 34, and a condensing lens 36 are disposed in the optical path 28 to form an optical path 28 between the laser diode 25 and the electrooptic element 26. In addition, at positions corresponding to the polarized beam splitters 30 and 33 on the side of the optical path 28 are provided photodiodes 38 and 39. These photodiodes 38 and 39 are connected to an EOS oscilloscope, and convert the incident light into an electrical signal, and can transmit this to an EOS oscilloscope.

In addition, the polarized beam splitters 30 and 33 can function as an isolator that splits the reflected beam from the electrooptic element 26 transiting the optical path 28 and reflects it to the photodiodes 38 and 39.

In addition, as shown in the figure, electromagnetic shield members 41 and 42 are provided so as to be separated from each other and respectively surrounding the neighborhood of the photodiodes 38 and 39 and the polarized beam splitters 30 and 33, and the neighborhood of the laser diode 25.

Among these, the electromagnetic shield member 42 that covers the neighborhood of the photodiodes 38 and 39 and the polarized beam splitters 30 and 33 is formed by aluminum foil, while in contrast, the electromagnetic shield member 41 covering the laser diode 25 is formed by a copper foil that has been silver-plated so that it has favorable electro-conductivity.

Furthermore, in the electrooptic probe 21, the probe head 23 and the support member 44 that forms one part of the probe body 22 and supports the probe head 23 are formed by polyacetal resin.

Next, the operation and effect will be explained.

Moreover, here the frequency of the signal that is the object of measurement is in the order of several GHz.

In the case that the electrooptic probe 21 is used in signal measurement, the EOS oscilloscope is activated with the end terminal 27b of the metallic pin 27 in contact with the measurement point. Thereby, based on the control signal generated from the EOS oscilloscope, a laser beam is emitted from the laser diode 25, and this laser beam is converted to a parallel beam by the collimator lens 29, travels straight along the optical path 28, is converged by the condensing lens 36, and arrives at the electrooptic element 26.

Because the condensing lens 36 is disposed at a position separated only by the focal distance of the condensing lens 36 from the reflecting film 26a, the laser beam converged by the condensing lens 36 is converged at one point on the reflecting film 26a. Furthermore, this laser beam is reflected by reflecting film 26a, converted to a parallel beam by the condensing lens 36, and at the same time progresses along the optical path 28 to the laser diode 25 side.

At this time, because the state of the refractive index of the electrooptic element 26 changes due to the change in the field at the measuring point, when propagating along the electrooptic element 26, the polarization state of the light changes. With the state of its polarization changed, the light is separated by the polarized beam splitters 30 and 33, converged and incident on the photodiodes 38 and 39, and converted into an electrical signal. Thereby, the change in the polarization state of the laser beam is detected as an output difference between photodiodes 38 and 39, and the electrical signal of the measured point is measured.

In this case, the probe head 23 and the supporting member 44 function as insulators because they are formed by polyacetal resin, and therefore it is possible to prevent the detection of the change in the field due to the measured signal by photodiodes 38 and 39 as noise. In addition, because the probe head 23 and the supporting member 44 act as an insulator between the metallic pin 27 and the laser diode 25, it is possible to avoid the result that the change in field due to the measure signal acts as noise to the laser diode 25, that is, avoid the noise being included in the laser beam input into the electrooptic element 26.

Moreover, the probe head 23 and the supporting member 44 that are formed from polyacetal resin in this manner have superior workability, and in addition, can be formed inexpensively in comparison to ceramic. Furthermore, the polyacetal resin is light, and in addition, in comparison to other resins, is very strong, has a high heat-deformation temperature, and thus can be applied favorably to the probe head 23 and the supporting member 44.

In addition, because the laser diode 25 is shielded by the electromagnetic shield member 42, it is possible to decrease further the propagation of the field due to the measured signal. In this case, because the electromagnetic shield member 42 is formed by a copper foil that has been silver-plated, and the surface conductivity is good, it is appropriate in particular for shielding noise of high frequency waves (several GHz), and when the electric signal which is the object of measurement, as in the present embodiment, consists of high frequency waves of several GHz, it has a striking shielding effect.

In addition, because the electromagnetic shield member 41 shields the photodiodes 38 and 39, it is possible to decrease further the propagation of noise to the photodiodes 38 and 39. In addition, because the electromagnetic shield member 41 is formed by an aluminum foil, it can be particularly appropriate for shielding the electric signal of the measured object from low frequency noise of several MHz to several tens of MHz. Therefore, when detecting a measured signal by sampling it after being converting down to a lower frequency, concern about noise decreasing the measuring precision from the display, etc, can be ameliorated.

Moreover, in the above embodiment, it is possible to use other structures and still be within the gist of the present invention.

For example, in the above embodiment, the electromagnetic shield member 41 is formed by aluminum foil, but instead, it is possible to use an aluminum tube.

In addition, in the present embodiment, if a continuous beam is generated from the laser diode 25, it is possible to carry out signal measurement by conventional general-use measuring devices such as a real time oscilloscope, a sampling oscilloscope, or spectrum analyzer. In this case, instead of an EOS oscilloscope, it is possible to connect a real time oscilloscope, a sampling oscilloscope, or spectrum analyzer to photodiodes 38 and 39 via a dedicated controller.

What is claimed is:

1. An electrooptic probe in which an optical path is established, the probe comprising:

a probe body having a base terminal, an end terminal, a probe head formed by an insulating body, and a supporting member comprising an insulating body and supporting said probe head, the optical path being established in the probe body between the base terminal and the end terminal of the probe body;

a laser diode being disposed at one end of said optical path so as to be enclosed in a first enclosing portion of the base terminal of said probe body;

an electrooptic element having a reflecting film and being disposed at the other end of said optical path so as to be enclosed in the end terminal of said probe body;

a metallic pin having a base portion and an end portion, the metallic pin being provided at the end terminal of said probe body and being supported by the probe head so that the base portion of the metallic pin is connected to said electrooptic element and the end portion of the metallic pin protrudes from said probe body;

a photodiode enclosed in a second enclosing portion of said probe body; and an isolator disposed in the optical path, wherein a laser beam generated from said laser diode is incident on said electrooptic element via said optical path, the laser beam being reflected by the reflecting film provided on said electrooptic element and being separated by the isolator so as to impinge the photodiode and thereby be converted into an electric signal, and wherein the probe head, the first enclosing portion and the second enclosing portion are disposed so as to be separated from each other, and wherein said supporting member is disposed between the probe head, the first enclosing portion and the second enclosing portion.

2. The electrooptic probe of claim 1, wherein said insulating body is a polyacetal resin.

3. An electrooptic probe according to claim 2, wherein:

said photodiode and said laser diode are connected to an electrooptic sampling oscilloscope; and said laser diode generates said laser beam as a pulse beam based on a control signal from said electrooptic sampling oscilloscope.

4. An electrooptic probe according to claim 2 wherein:

said laser diode is generates said laser beam as a continuous beam.

5. An electrooptic probe in which an optical path is established, the probe comprising:

a probe body having a base terminal, an end terminal, a probe head formed by an insulating body, and a supporting member comprising an insulating body and supporting said probe head, the optical path being established in the probe body between the base terminal and the end terminal of the probe body;

a laser diode being disposed at one end of said optical path so as to be enclosed in the base terminal of said probe body;

an electrooptic element having a reflecting film and being disposed at the other end of said optical path so as to be enclosed in the end terminal of said probe body;

a metallic pin having a base portion and an end portion, the metallic pin being provided at the end terminal of the probe body so that the base portion of the metallic pin is connected to said electrooptic element and the end portion protrudes from said probe body;

an isolator mounted in the optical path;

a photodiode enclosed in the probe body; and an electromagnetic shield member provided so as to surround the photodiode and the laser diode, wherein a laser beam generated from said laser diode is incident on said electrooptic element via said optical path, and is reflected by the reflecting film to be split by the isolator and then converted by the photodiode into an electric signal.

6. An electrooptic probe according to claim 5, wherein an electromagnetic shield material that shields said laser diode and an electromagnetic shield material that shields said photodiode are disposed so as to be separated from each other.

7. An electrooptic probe according to claim 6, wherein the electromagnetic shield member that shields said photodiode comprises aluminum.

8. An electrooptic probe according to claim 7, wherein:

said photodiode and said laser diode are connected to an electrooptic sampling oscilloscope; and said laser diode a laser signal as a pulse beam based on a control signals from said electrooptic sampling oscilloscope.

9. An electrooptic probe according to claim 7, wherein the laser diode generates a continuous beam as a laser beam.

10. An electrooptic probe according to claim 6, wherein the eletromagentic shield material that shields said laser diode comprises a silver-plated copper foil.

11. An electrooptic probe according to claim 10, wherein:

said photodiode and said laser diode being connected to an electooptic sampling oscilloscope; and said laser diode generating said laser beam as a pulse beam based on a control signal from said electrooptic sampling oscilloscope.

12. An electrooptic probe according to claim 10, wherein said laser diode generates a continuous beam as said laser beam.

* * * * *